United States Patent [19]

Yukawa

[11] Patent Number: 5,136,181

[45] Date of Patent: Aug. 4, 1992

[54] POWER-ON-RESET CIRCUIT

[75] Inventor: Akira Yukawa, Tokyo, Japan

[73] Assignee: NEC Corporation, Tokyo, Japan

[21] Appl. No.: 766,010

[22] Filed: Sep. 26, 1991

[30] Foreign Application Priority Data

Sep. 30, 1990 [JP] Japan .................................. 2-263673

[51] Int. Cl.$^5$ ............................................ H03K 17/22
[52] U.S. Cl. .............................. 307/296.1; 307/272.3;
307/296.2; 307/443; 307/448; 307/451
[58] Field of Search ............... 307/296.1, 296.2, 272.3,
307/443, 448, 451

[56] References Cited

U.S. PATENT DOCUMENTS

| | | | |
|---|---|---|---|
| 4,409,501 | 10/1983 | Eickerman et al. | 307/272.3 |
| 4,812,679 | 3/1989 | Mahabadi | 307/272.3 |
| 4,885,476 | 12/1989 | Mahabadi | 307/272.3 |

Primary Examiner—Stanley D. Miller
Assistant Examiner—Scott A. Ouellette
Attorney, Agent, or Firm—Laff, Whitesel, Conte & Saret

[57] ABSTRACT

A power-on-reset circuit includes first to third first-conductive-type MOSFETs, a second-conductive-type MOSFET, a capacitance, and first to third resistances. In the power-on-reset circuit, whether a reset signal is supplied to an external circuit is determined by threshold voltages of the MOSFETs and independent on the building-up speed of the power supply voltage.

5 Claims, 2 Drawing Sheets

POWER-ON-RESET CIRCUIT

FIELD OF THE INVENTION

This invention relates to a power-on-reset circuit, and more particularly to, a power-on-reset circuit which supplies a reset signal to a CMOS integrated circuit at an initial state of applying a power supply.

BACKGROUND OF THE INVENTION

A conventional power-on-reset circuit includes a Schmitt circuit connected between first and second power supply lines, a capacitance connected between the second power supply line and a circuit node which is connected to an input of the Schmitt circuit, and a resistance connected between the first power supply line and the circuit node. The capacitance and the resistance compose a C-R delay circuit having a predetermined time constant.

In operation, when a power supply voltage is applied across first and second power supply lines, the Schmitt circuit becomes operation state, and the potential level of the circuit node rises, however, the potential level thereof does not become high level completely until the capacitance is charged up, in other words, the potential level thereof becomes high level after the elapse of the time constant of the C-R delay circuit, so that the Schmitt circuit is supplied with a low level signal and supplies a high level signal of logic "1" as a reset signal to an external circuit, that is a CMOS integrated circuit for example, for a predetermined time equal to the time constant. When the potential level of the circuit node becomes higher than the threshold voltage of the Schmitt circuit, the Schmitt circuit supplies the CMOS integrated circuit with a low level signal of logic "0" and maintains supplying the low level signal thereto. Thus, the power-on-reset circuit supplies a high level signal as a reset signal to the CMOS integrated circuit for a predetermined time at an initial state of applying a power supply voltage to the power-on-reset circuit. Such a power-on-reset circuit has an advantage in that the power consumption thereof is considerably small, because it has no direct current path.

According to the conventional power-on-reset circuit, however, there is a disadvantage in that the Schmitt circuit may not supply a high level reset signal to the CMOS integrated circuit at an initial state of applying the power supply voltage thereto if the building up of the voltage is slow, because operation of the Schmitt circuit is delayed. Further, there is another disadvantage in that the Schmitt circuit may not supply a high level reset signal to the CMOS integrated circuit in case of a temporary reduction of a power supply voltage in which the CMOS integrated circuit is required to be reset, because the capacitance maintains the charge-up voltage. In such a case, the power-on-reset circuit may not supply a reset signal unless the power supply voltage becomes lower than the threshold voltage of the Schmitt circuit.

SUMMARY OF THE INVENTION

Accordingly, it is an object of the invention to provide a power-on-reset circuit which supplies a high level signal as a reset signal to an external circuit without depending on the building-up speed of the power supply voltage in an initial state.

It is another object of the invention to provide a power-on-reset circuit which supplies a high level signal as a reset signal to an external circuit after the temporary reduction of the power supply voltage.

According to a feature of the invention, a power-on-reset circuit comprises:

a first first-conductive-type MOSFET connected at a gate to a first node, at a source to a second power supply line, and at a drain to a second node;

a second first-conductive-type MOSFET connected at a gate to a third node, at a source to the second power supply line, and at a drain to a fourth node;

a third first-conductive-type MOSFET connected at a gate to the fourth node, at a source to the second power supply line, and at a drain to the third node;

a second-conductive-type MOSFET connected at a gate to the third node, at a source to a first power supply line, and at a drain to the fourth node;

a capacitance connected between the first power supply line and the third node;

a first resistance connected between the first power supply line and the first node;

a second resistance connected between the first and second nodes; and a third resistance connected between the second and third nodes;

wherein the second first-conductive-type MOSFET and the second-conductive-type MOSFET are connected complementarily between the first and second power supply lines to compose an inverter; and a threshold voltage of the second first-conductive-type MOSFET is lower than that of the first first-conductive-type MOSFET.

BRIEF DESCRIPTION OF THE DRAWINGS

The invention will be explained in more detail in conjunction with appended drawings wherein.

DESCRIPTION OF THE PREFERRED EMBODIMENTS

Figure 1:
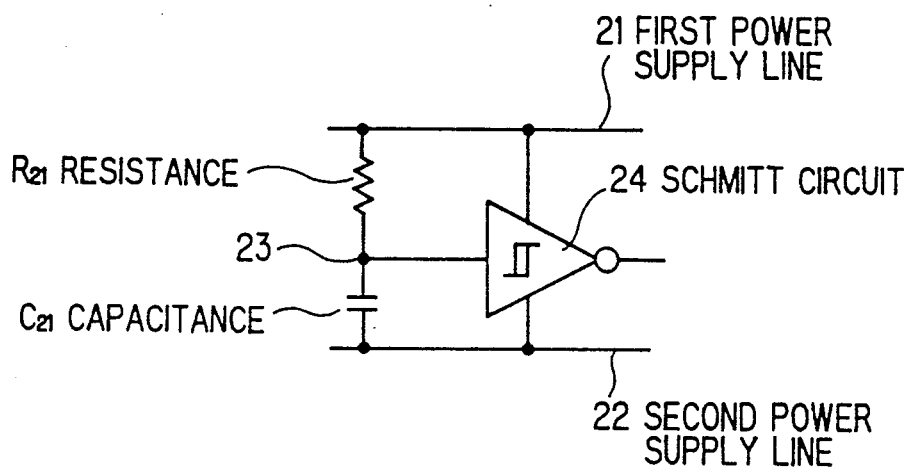
FIG. 1 is a circuitry diagram of a conventional power-on-reset circuit.

Before describing a power-on-reset circuit in a preferred embodiment according to the invention, the conventional power-on-reset circuit described before will be explained in conjunction with FIG. 1.

The conventional power-on-reset circuit includes a Schmitt circuit 24 having a hysteresis characteristic connected between first and second power supply line 21 and 22, a capacitance C21 connected between the second power supply line 22 and a circuit node 23 which is connected to an input terminal of the Schmitt circuit 24, and a resistance R21 connected between the first power supply line 21 and the circuit node 23. The capacitance C21 and the resistance R21 compose a C-R delay circuit.

Operation of the conventional power-on-reset circuit will not explained here, because the explanation thereof has been carried out before.

Figure 2:
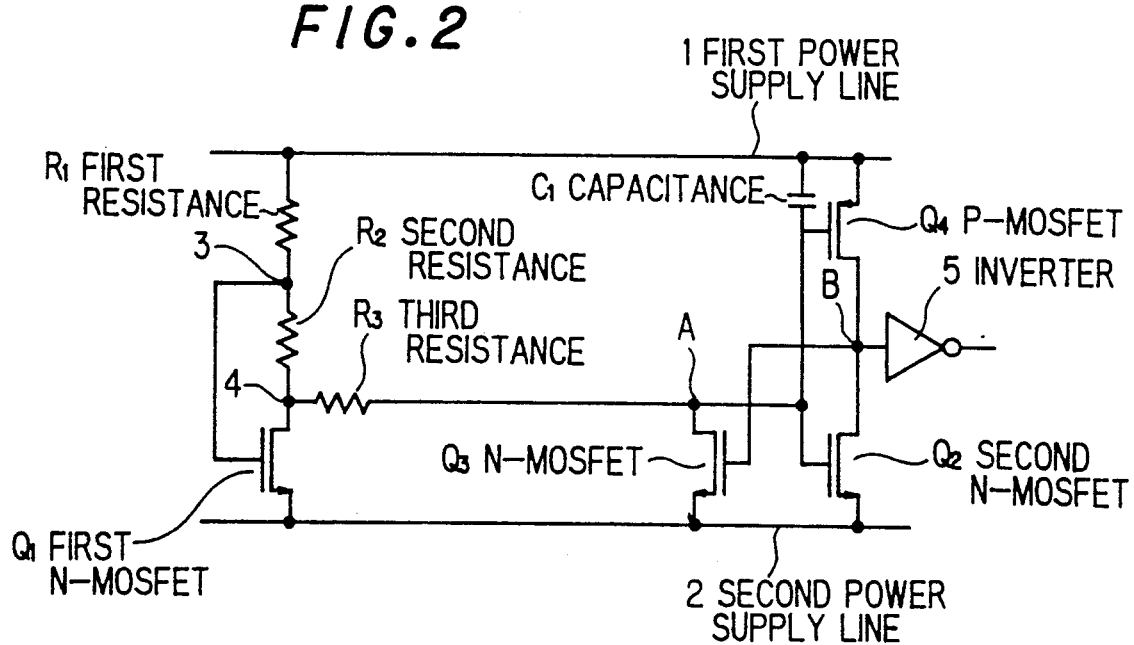
FIG. 2 is a circuitry diagram of a power-on-reset circuit in a preferred embodiment according to the invention.

Next, a power-on-reset circuit in a preferred embodiment according to the invention will be explained. As shown in FIG. 2, the power-on-reset circuit includes an inverter 5, first to third N-MOSFETs Q1 to Q3, a P-MOSFET Q4, a capacitance C1, and first to third resistances R1 to R3. The inverter 5 is connected at an input terminal with a node B to supply a reset signal to an external circuit, that is a CMOS integrated circuit for example (not shown in FIG. 2). The first N-MOSFET Q1 is connected at a gate to a node 3, at a source to a second power supply line 2, and at a drain to a node 4. The second N-MOSFET Q2 is connected at a gate to a node A, at a source to the second power supply line 2, and at a drain to the node B. The threshold voltage of the second N-MOSFET Q2 is lower than that of the first N-MOSFET Q1. The third N-MOSFET Q3 is connected at a gate to the node B, at a source to the second power supply line 2, and at a drain to the node A. The P-MOSFET Q4 is connected at a gate to the node A, at a source to a first power supply line 1, and at a drain to the node B. The second N-MOSFET Q2 and the P-MOSFET Q4 are connected complementarily between the first and second power supply lines 1 and 2 to compose an inverter. The capacitance C1 is connected between the first power supply line 1 and the node A. The first resistance R1 is connected between the first power supply line 1 and the node 3. The second resistance R2 is connected between the nodes 3 and 4.

The third resistance R3 is connected between the nodes 4 and A.

Next, operation of the power-on-reset circuit will be explained in conjunction with FIG. 3.

First, operation of the power-on-reset circuit in case of gradual building-up of the power supply voltage $V_{DO}$ from 0 V to the predetermined level in the initial state will be explained. Every point in the circuit has 0 V potential at the initial state before applying the power supply voltage thereto. When the power supply is just applied, the first to third N-MOSFETs Q1 to Q3 are all in OFF state, so that there flows no current through the resistances R1 to R3. Therefore, voltages of the nodes 3, 4 and A increase as the first power supply level increases. Voltages of gates of the first and second N-MOSFETs Q1 and Q2 increase in accordance with the increase of the first power supply level, so that the first and second N-MOSFETs Q1 and Q2 become ON state when the first power supply level becomes higher than the threshold voltages of the first and second N-MOSFETs Q1 and Q2.

As set out before, the threshold voltage of the second N-MOSFET Q2 is lower than that of the first N-MOSFET Q1, so that the second N-MOSFET Q2 becomes ON state earlier than the first N-MOSFET Q1. Therefore, the voltage of the node B becomes the same level as the second power supply line 2, that is the low level, so that the inverter 5 is supplied with a low level to supply the CMOS integrated circuit with a high level signal as a reset signal.

When the first power supply level $V_{DO}$ becomes higher than the threshold voltage $V_T$ of the first N-MOSFET Q1, the first N-MOSFET Q1 becomes ON state, so that a current flows through the first and second resistances R1 and R2 and the first N-MOSFET Q1. Therefore, voltage drop occurs at the first and second resistances R1 and R2, so that the voltages of the nodes 3 and 4 decrease. The voltage $V_O$ of the node A also decreases, as shown in FIG. 3. The voltage $V_O$ can be calculated by the following formula (1) on condition of $K \cdot R1 \gg 1$:

$$V_O = V_T + (V_T - V_{DO})R2/R1 \quad (1)$$

Where K is an element constant of the first N-MOSFET Q1 and represented by the formula (2):

$$K = C_O \mu W/L \quad (2)$$

Where $C_O$ is a capacitance of a gate insulation layer of the first N-MOSFET Q1, $\mu$ is the mobility of electrons, W is the channel width, and L is the channel length.

The voltage $V_O$ decreases when the first power supply level $V_{DO}$ becomes higher than the threshold voltage $V_T$ of the first N-MOSFET Q1. The gradient of the decreasing of the voltage $V_O$ is determined by R2/R1 approximately. On the other hand, the logic threshold voltage $V_{TH}$ of the inverter consisting of the second N-MOSFET Q2 and the P-MOSFET Q4 is represented by the following formula (3):

$$V_{TH} = \frac{V_{DO} - |V_{TP}| + (K_N/K_P)^{\frac{1}{2}} V_{TN}}{1 + (K_N/K_P)^{\frac{1}{2}}} \quad (3)$$

Where $V_{TN}$ and $V_{TP}$ are threshold voltages of the second N-MOSFET Q2 and the P-MOSFET Q4 respectively, and $K_N$ and $K_P$ are element constants of the second N-MOSFET Q2 and the P-MOSFET Q4 respectively.

The threshold voltage $V_{TH}$ increases linearly as the first power supply level $V_{DO}$ increases after becoming larger than the threshold voltage $V_T$ of the first N-MOSFET Q1.

Figure 3:
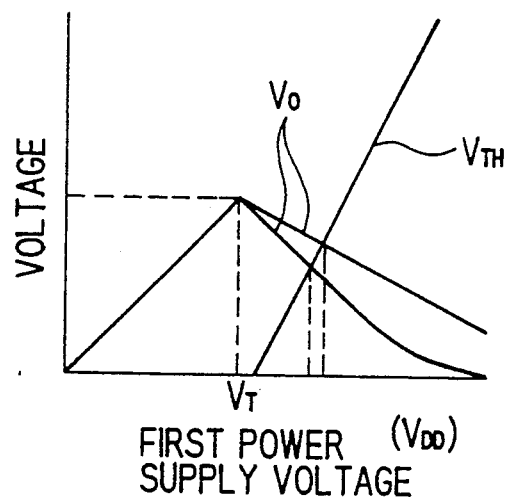
FIG. 3 is a graph showing a voltage $V_O$ at an input of an inverter in the power-on-reset circuit of the preferred embodiment relative to the first power supply voltage $V_{DO}$, and a threshold voltage $V_{TH}$ relative to the voltage $V_{DO}$.

As shown in FIG. 3, the voltage $V_O$ of the node A is higher than the threshold voltage $V_{TH}$ if the first power supply level $V_{DO}$ is relatively small, so that the voltage of the node B remains low level, that is logic level "0". However, the voltage $V_O$ becomes lower than the threshold voltage $V_{TH}$ if the first power supply level $V_{DO}$ is relatively large, so that the the voltage of the node B becomes high level, that is logic level "1". Therefore, the inverter 5 is supplied with a high level signal to supply the CMOS integrated circuit with a low level. As the same time, the third N-MOSFET Q3 becomes ON state, so that the voltage $V_O$ of the node A becomes the same level as the second power supply line 2, that is the low level. Therefore, the voltage of the node B is maintained to be high level, so that the inverter 5 supplies the CMOS integrated circuit with a low level signal.

Thus, the power-on-reset circuit supplies the CMOS integrated circuit with a high level signal as a reset signal in the initial state of applying a power supply voltage thereto until the first power supply level $V_{DO}$ becomes the predetermined level, and supplies the CMOS integrated circuit with a low level signal when the first power supply level $V_{DO}$ becomes higher than the predetermined level.

Next, operation of the power-on-reset circuit in case of steep building-up of the first power supply voltage $V_{DO}$ from 0 V to the predetermined level in the initial state of applying the power supply voltage thereto will be explained. When the first power supply voltage $V_{DO}$ increases steeply to be a predetermined level, the first N-MOSFET Q1 becomes ON instantly. On the other hand, the voltage $V_O$ of the node A increases to be a high level, because the the node A is connected with the first power supply line 1 through the capacitance C1. Therefore, the second N-MOSFET Q2 is applied at a gate with a high level, so that the second N-MOSFET Q2 becomes ON. Consequently, the voltage of the node B becomes the same level as the second power supply line 2, that is logic level "0", so that the inverter 5 supplies a high level signal as a reset signal to the CMOS integrated circuit. However, the voltage $V_O$ decreases gradually, because charges in the node A are discharged to the second power supply line 2 through the third resistance R3 and the first N-MOSFET Q1. When the voltage $V_O$ becomes lower than the logic threshold voltage $V_{TH}$, the voltage of the node B becomes high level, that is logic high level "1", so that the third N-MOSFET Q3 becomes ON to discharge the node A completely. The discharging time is determined by values of the capacitance C1 and the third resistance R3, that is approximately the product of C1·R3.

Next, operation of the power-on-reset circuit in case of a temporary reduction of the first power supply voltage $V_{DO}$ will be explained. In the first case, it is assumed that there is a relation of $|V_{TP}| > V_T$. Thus, the P-MOSFET Q4 becomes OFF, when the first power supply voltage $V_{DO}$ decreases to be lower than $|V_{TP}|$. Therefore, the voltage of the node B decreases to make the third N-MOSFET Q3 OFF, so that the node B is discharged completely and the voltage thereof becomes low. Consequently, it is ready for supplying a reset signal to the CMOS integrated circuit. On the other hand, it is assumed in the second case that there is a relation of $|V_{TP}| < V_T$, the third N-MOSFET Q3 becomes OFF, when the first power supply voltage $V_{DO}$ decreases to be lower than $V_T$, so that the voltage $V_O$ of the node A increases to make the P-MOSFET Q4 OFF. Consequently, the voltage of the node B becomes low to be ready for supplying a reset signal to the CMOS integrated circuit.

Thus, in the power-on-reset circuit in the preferred embodiment, a reset signal can be supplied to the CMOS integrated circuit in any building-up mode of the power supply voltage $V_{DO}$ independently with the time constant conventionally affecting the building-up thereof. The turning point of supplying a reset signal (corresponding to the point of intersection of the lines $V_O$ and $V_{TH}$ in FIG. 3) is determined within a wide range by changing values of R1, R2, $K_N$ and $K_P$, as shown in the formula (3). Additionally, the effective operation of the power-on-reset circuit can be obtained, because the voltage corresponding to the turning point of supplying a reset signal is higher than both threshold voltages of an N-MOSFET and a P-MOSFET used in the circuit. Further, a reset signal can be supplied to an external circuit even if the first power supply voltage $V_{DO}$ decreases to be lower than a voltage which is higher between $|V_{TP}|$ and $V_T$. Therefore, the first power supply voltage $V_{DO}$ is allowed to decrease down to the vicinity of a lower operation voltage of the CMOS integrated circuit.

In the power-on-reset circuit, the inverter 5 may be replaced by a Schmitt circuit having a hysteresis characteristic. Additionally, an N-MOSFET and a P-MOSFET can replace each other, and the first and second power supply voltages can replace each other.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A power-on-reset circuit, comprising:
   a first first-conductive-type MOSFET connected at a gate to a first node, at a source to a second power supply line, and at a drain to a second node;
   a second first-conductive-type MOSFET connected at a gate to a third node, at a source to said second power supply line, and at a drain to a fourth node;
   a third first-conductive-type MOSFET connected at a gate to said fourth node, at a source to said second power supply line, and at a drain to said third node;
   a second-conductive-type MOSFET connected at a gate to said third node, at a source to a first power supply line, and at a drain to said fourth node;
   a capacitance connected between said first power supply line and said third node;
   a first resistance connected between said first power supply line and said first node;
   a second resistance connected between said first and second nodes; and
   a third resistance connected between said second and third nodes;
   wherein said second first-conductive-type MOSFET and said second-conductive-type MOSFET are connected complementarily between said first and second power supply lines to compose an inverter; and
   a threshold voltage of said second first-conductive-type MOSFET is lower than that of said first first-conductive-type MOSFET.

2. A power-on-reset circuit, according to claim 1, further comprising:
   an inverter connected at an input to said fourth node to generate a reset signal in a semiconductor integrated circuit.

3. A power-on-reset circuit, according to claim 2, wherein:
   said semiconductor integrated circuit is a CMOS integrated circuit.

4. A power-on-reset circuit, according to claim 2, wherein:
   a voltage of said first power supply of generating said reset signal is adjusted by a ratio of values of said first and second resistances.

5. A power-on-reset circuit, according to claim 4, wherein:
   said voltage of said first power supply of generating said reset signal is further adjusted by elements constant of said MOSFETs.

* * * * *